US009595433B2

(12) United States Patent
Takahashi (10) Patent No.: US 9,595,433 B2
(45) Date of Patent: Mar. 14, 2017

(54) SUBSTRATE PROCESSING METHOD AND SUBSTRATE PROCESSING APPARATUS

(71) Applicant: DAINIPPON SCREEN MFG. CO., LTD., Kyoto (JP)

(72) Inventor: Hiroaki Takahashi, Kyoto (JP)

(73) Assignee: SCREEN Holdings Co., Ltd. (JP)

( * ) Notice: Subject to any disclaimer, the term of this patent is extended or adjusted under 35 U.S.C. 154(b) by 615 days.

(21) Appl. No.: 13/713,606

(22) Filed: Dec. 13, 2012

(65) Prior Publication Data

US 2013/0255718 A1    Oct. 3, 2013

(30) Foreign Application Priority Data

Mar. 29, 2012   (JP) ................................ 2012-078235

(51) Int. Cl.
*B08B 3/04*    (2006.01)
*H01L 21/02*   (2006.01)
*H01L 21/67*   (2006.01)

(52) U.S. Cl.
CPC .. *H01L 21/02054* (2013.01); *H01L 21/67051* (2013.01); *H01L 21/6704* (2013.01)

(58) Field of Classification Search
None
See application file for complete search history.

(56) References Cited

U.S. PATENT DOCUMENTS

| 5,643,368 A * | 7/1997 | Nakashima | B08B 3/04 |
| | | | 134/1.3 |
| 2004/0112405 A1* | 6/2004 | Lee | G03F 7/425 |
| | | | 134/1.3 |
| 2006/0011214 A1* | 1/2006 | Liu | B08B 3/08 |
| | | | 134/2 |
| 2008/0066783 A1 | 3/2008 | Tanaka | 134/21 |
| 2008/0121252 A1* | 5/2008 | Miya | 134/4 |
| 2011/0230054 A1 | 9/2011 | Tomita et al. | 438/758 |
| 2011/0277793 A1 | 11/2011 | Inada et al. | 134/18 |
| 2011/0308549 A1 | 12/2011 | Minami et al. | 134/18 |

FOREIGN PATENT DOCUMENTS

| JP | 2006-344907 | 12/2006 |
| JP | 2007-288103 | 11/2007 |
| JP | 2008-041873 | 2/2008 |
| JP | 2008-109058 | 5/2008 |
| JP | 2008-235342 | 10/2008 |
| JP | 2009-254965 | 11/2009 |
| JP | 2009-267167 A | 11/2009 |

(Continued)

*Primary Examiner* — Michael Kornakov
*Assistant Examiner* — Ryan Coleman
(74) *Attorney, Agent, or Firm* — OSTROLENK FABER LLP (57) ABSTRACT

A substrate processing method includes a rinsing step of supplying water of a first temperature to a surface of a silicon substrate to apply a rinsing process using the water to the silicon substrate surface, a second temperature water supplying (coating) step of supplying water of a second temperature lower than the first temperature to the silicon substrate surface after the rinsing step, and a drying step of rotating the silicon substrate after the second temperature water supplying step to spin off the water on the silicon substrate surface to a periphery of the silicon substrate and thereby dry the silicon substrate.

5 Claims, 3 Drawing Sheets

(56) References Cited

FOREIGN PATENT DOCUMENTS

| | | |
|---|---|---|
| JP | 2010-80668 A | 4/2010 |
| JP | 2011-071401 | 4/2011 |
| JP | 2011-192885 | 9/2011 |
| JP | 2011-204712 | 10/2011 |
| JP | 2012-004539 | 1/2012 |
| TW | I352384 B | 11/2011 |

* cited by examiner

SUBSTRATE PROCESSING METHOD AND SUBSTRATE PROCESSING APPARATUS

BACKGROUND OF THE INVENTION

1. Field of the Invention

The present invention relates to a substrate processing method and a substrate processing apparatus for applying a process to a silicon substrate.

2. Description of Related Art

In a manufacturing process for a semiconductor device, a silicon semiconductor wafer (hereinafter referred to simply as "wafer") is processed, for example, one at a time. Specifically, a chemical solution is supplied to a surface of the wafer to process the wafer surface by the chemical solution. Thereafter, DIW (deionized water) is supplied to the wafer surface to wash off the chemical solution, attached to the wafer surface, by the DIW (rinsing process). After the chemical solution is washed off, the wafer is rotated at high speed to spin off the DIW on the wafer surface and the wafer is thereby dried.

Also, an art of suppressing water mark formation by supplying IPA (isopropyl alcohol), which is lower in boiling point than water, to a wafer surface to replace the DIW attached to the wafer surface by IPA is known. After replacement by IPA, the wafer is rotated at high speed to remove the IPA attached to the wafer surface from the substrate and the wafer is thereby dried.

SUMMARY OF THE INVENTION

The drying of the wafer by high speed rotation is considered to be mainly due to evaporation of the DIW from the surface of the wafer being rotated at high speed rather than to scattering of the DIW from a circumferential edge of the wafer. Thus, in a case where foreign matter is contained in a droplet of DIW remaining on the wafer surface after the rinsing process, the DIW evaporates on the spot before the foreign matter is spun off from the wafer after the start of high speed rotation of the wafer and just the foreign matter may remain on the wafer surface.

Also, IPA and other organic solvents are expensive, and from a standpoint of reducing running cost, suppression of water mark formation without using IPA is desired.

Thus, an object of the present invention is to provide a substrate processing method and a substrate processing apparatus that enable a silicon substrate to be dried while preventing remaining of foreign matter on a surface of the silicon substrate.

Another object of the present invention is to provide a substrate processing method and a substrate processing apparatus that enable water mark formation to be suppressed without use of an organic solvent.

A substrate processing method according to the present invention includes a rinsing step of supplying water of a first temperature to a surface of a silicon substrate to apply a rinsing process using the water to the silicon substrate surface, a second temperature water supplying (coating) step of supplying water of a second temperature lower than the first temperature to the silicon substrate surface after the rinsing step, and a drying step of rotating the silicon substrate after the second temperature water supplying step to spin off the water on the silicon substrate surface to a periphery of the silicon substrate and thereby dry the silicon substrate.

With the method according to the present invention, after the rinsing process using the water of the first temperature, the water of the second temperature lower than the first temperature is supplied to the silicon substrate surface before the drying process is started. Thus, when the drying process is started, the water of the comparatively low second temperature is attached to the silicon substrate surface. The water of the low second temperature is less likely to evaporate in comparison to the water of the first temperature.

In the state where the water of the low second temperature is attached to the silicon substrate surface, even when the drying process by rotation of the silicon substrate is started, the water of the second temperature that is attached to the silicon substrate surface does not evaporate immediately after the start of the drying process. Thus, in a case where foreign matter is contained in the water of the second temperature, the water of the second temperature is present at a periphery of the foreign matter for a while even after the start of the drying process. The water is then spun off together with the foreign matter from the silicon substrate surface by the rotation of the silicon substrate. The silicon substrate can thereby be dried while preventing the remaining of foreign matter on the silicon substrate surface.

Also, the rinsing process is performed on the silicon substrate surface using the water of the first temperature that is higher than the second temperature. The rinsing process performed using the water of the comparatively high first temperature is higher in processing efficiency than a rinsing process performed using the water of the comparatively low second temperature. The rinsing process can thus be applied satisfactorily to the silicon substrate surface.

Also, in a case where water is attached to the silicon substrate surface, elution of silicon (Si) from the silicon substrate into the water is suppressed more when the water is of the lower second temperature than when the water is of the first temperature.

The drying process is started in the state where the water of the comparatively low second temperature is attached to the silicon substrate surface and thus hardly any silicon that causes water marks is contained in the water attached to the silicon substrate surface when the drying process is started. Formation of a water mark on the silicon substrate surface is thus unlikely to occur after the drying process. Water mark formation can thus be suppressed without use of an organic solvent, such as IPA.

The first temperature may be an ordinary temperature or room temperature (approximately 25° C.). It may also be a temperature (for example 40° C. to 80° C.) higher than the ordinary temperature or room temperature. The second temperature may be a temperature lower than the ordinary temperature or room temperature (and yet a temperature higher than a freezing point of water). For example, it may be a temperature in a range of 5 to 10° C.

A substrate processing method according to a preferred embodiment of the present invention further includes a substrate rotating step of rotating the silicon substrate that is executed in parallel to the rinsing step and the second temperature water supplying step.

With this method, the silicon substrate is rotated in parallel to the supplying of the water of the second temperature to enable the water of the second temperature to be spread across an entirety of the silicon substrate surface. Remaining of foreign matter can thereby be prevented over the entirety of the silicon substrate surface and water mark formation can be suppressed over the entirety of the silicon substrate surface.

The substrate processing method may further include a chemical solution supplying step executed before the rinsing step and where a chemical solution is supplied to the silicon substrate surface to apply a process by the chemical solution to the silicon substrate surface. The chemical solution may be a cleaning liquid for cleaning the silicon substrate surface or may be an etching liquid that etches a film on the surface of the silicon substrate.

The substrate processing method may further include a hydrofluoric acid supplying step executed before the rinsing step and where a hydrofluoric acid is supplied to the silicon substrate surface to apply a process using the hydrofluoric acid to the silicon substrate surface.

The silicon substrate surface becomes a hydrophobic surface after the process using the hydrofluoric acid. Silicon elutes readily from the hydrophobic surface.

With the method according to the present invention, even if the silicon substrate surface is a hydrophobic surface, the water that contacts the silicon substrate surface when the drying process is started is of the low second temperature and thus silicon is unlikely to elute from the hydrophobic surface into the water. Silicon is thus hardly contained in the water remaining on the silicon substrate surface when the drying process is started. Water mark formation can thereby be suppressed even in the drying process performed after the process using the hydrofluoric acid.

The substrate processing method may further include a step of making a facing member, having a facing surface facing the silicon substrate surface, rotate in the same direction as the silicon substrate, and, at the same, time supplying a gas between the facing surface and the silicon substrate surface in parallel to the drying step.

A substrate processing apparatus according to the present invention includes a substrate rotating unit that rotates a silicon substrate while holding the substrate, a first temperature water supplying unit that supplies water of a first temperature to a surface of the silicon substrate held by the substrate rotating unit, a second temperature water supplying unit that supplies water of a second temperature lower than the first temperature to the surface of the silicon substrate held by the substrate rotating unit, and a control unit that controls the substrate rotating unit, the first temperature water supplying unit, and the second temperature water supplying unit to execute a rinsing step of supplying the water of the first temperature to the silicon substrate surface to apply a rinsing process using the water to the silicon substrate surface, a second temperature water supplying step of supplying the water of the second temperature to the silicon substrate surface after the rinsing step, and a drying step of rotating the silicon substrate after the second temperature water supplying step to spin off the water on the silicon substrate surface to a periphery of the silicon substrate and thereby to dry the silicon substrate.

The first temperature is preferably no less than the ordinary temperature or room temperature, and in this case, the second temperature water supplying unit may include a cooling unit that cools water to a temperature lower than the ordinary temperature or room temperature.

The above and yet other objects, characteristics, and effects of the present invention shall be made clear by the following description of preferred embodiments with reference to the attached drawings.

DETAILED DESCRIPTION OF THE PREFERRED EMBODIMENTS

Figure 1:
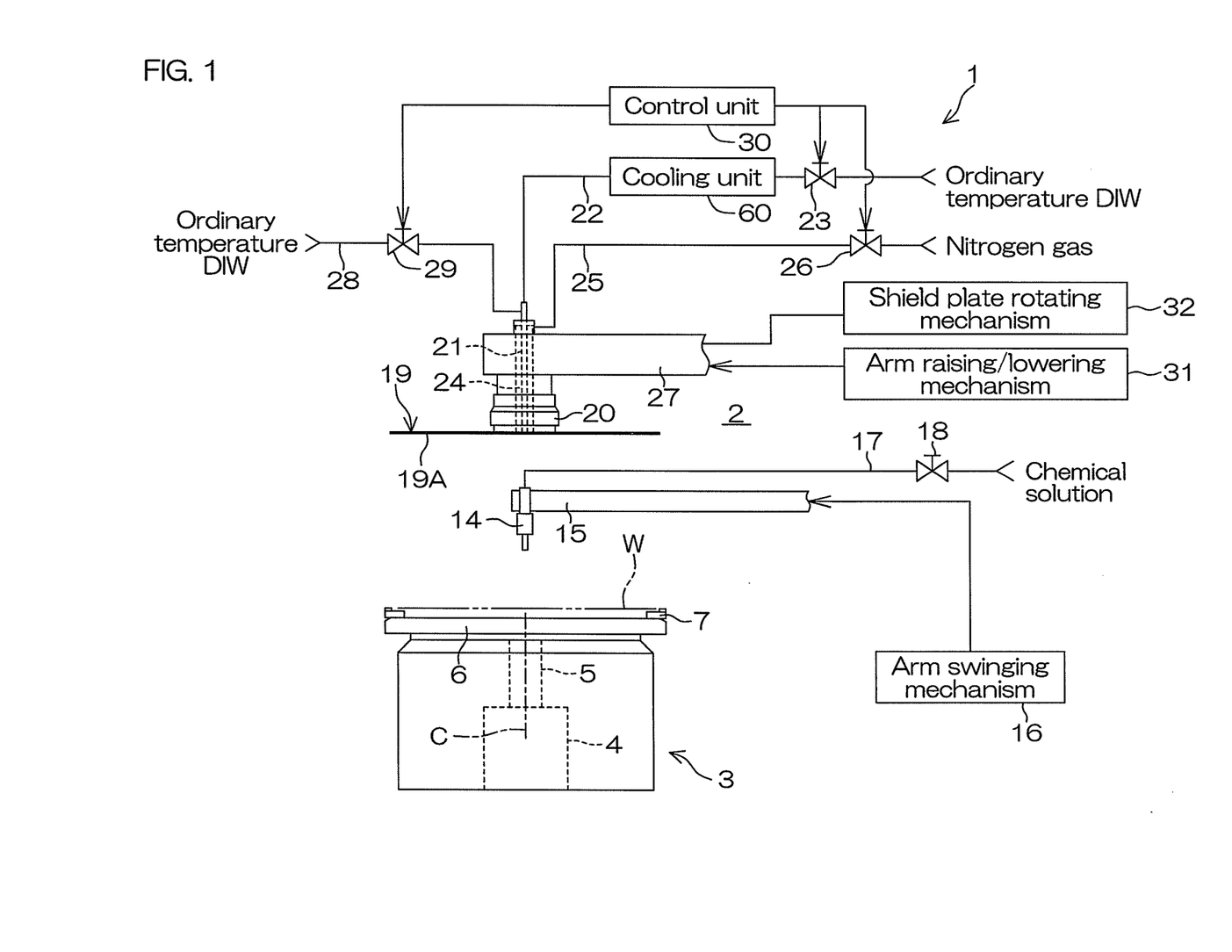
FIG. 1 is a schematic view of an arrangement of a substrate processing apparatus according to a preferred embodiment of the present invention.

FIG. 1 is a schematic view of an arrangement of a substrate processing apparatus 1 according to a preferred embodiment of the present invention. The substrate processing apparatus 1 is a one-by-one type apparatus for applying a cleaning process for removing contaminant using a chemical solution and DIW to a surface on a device forming region side of a circular semiconductor wafer W (referred to hereinafter simply as "wafer W") as an example of a silicon substrate. With the present preferred embodiment, an example of a case of using hydrofluoric acid (aqueous HF solution) as the chemical solution shall be described.

The substrate processing apparatus 1 includes, inside a processing chamber 2 partitioned by a partition wall (not shown), a spin chuck (substrate rotating unit) 3 that holds the wafer W in a substantially horizontal attitude and rotates the wafer W around a substantially vertical rotation axis C passing through a center of the wafer W and a chemical solution nozzle 14 for supplying the chemical solution (hydrofluoric acid, etc.) to the surface of the wafer W held by the spin chuck 3. Also, a shield plate (facing member) 19 for shielding an atmosphere in a vicinity of the surface of the wafer W held by the spin chuck 3 from its periphery is disposed above the spin chuck 3.

The spin chuck 3 includes a spin motor 4, a disk-shaped spin base 6 rotated around the rotation axis C by a rotational driving force of the spin motor 4, and a plurality of clamping members 7 that are for clamping the wafer W in the substantially horizontal attitude and are provided at substantially equal intervals at a plurality of locations on a circumferential edge of the spin base 6. The spin chuck 3 is thereby enabled to rotate the spin base 6 by the rotational driving force of the spin motor 4 in a state where the wafer W is clamped by the plurality of clamping members 7 to rotate the wafer W, maintained in the substantially horizontal attitude, around the rotation axis C together with the spin base 6.

The spin chuck 3 is not limited to a clamping type and a vacuum suction type chuck (vacuum chuck) may be employed instead. The vacuum chuck holds the wafer W in a horizontal attitude by vacuum suction of a rear surface of the wafer W and further rotates around a vertical rotation axis in this state to rotate the wafer W held by the spin chuck 3.

The chemical solution nozzle 14 is, for example, a straight nozzle that discharges the chemical solution in a continuous flow state and is mounted, in a state where a discharge port thereof is directed downward, to a tip portion of an arm 15 that extends substantially horizontally. The arm 15 is provided in a manner enabling swinging around a predetermined rotation axis. An arm swinging mechanism 16 for swinging the arm 15 within a predetermined angular range is coupled to the arm 15. By the swinging of the arm 15, the chemical solution nozzle 14 is moved between a position above the rotation axis C of the wafer W (position facing a rotation center of the wafer W) and a position set at a side of the spin chuck 3 (home position).

The chemical solution nozzle 14 is connected to a liquid supply pipe 17 to which hydrofluoric acid of an ordinary temperature or room temperature (approximately 25° C.) is supplied from a hydrofluoric acid supply source. A chemical solution valve 18 for opening and closing a flow passage of the liquid supply pipe 17 is interposed in a middle portion of the liquid supply pipe 17. When the chemical solution valve 18 is opened, the hydrofluoric acid is supplied to the chemical solution nozzle 14 from the liquid supply pipe 17 and the hydrofluoric acid is discharged from the chemical solution nozzle 14.

The shield plate 19 has a disk shape with substantially the same diameter as or with a diameter no less than the diameter of the wafer W. The shield plate 19 is disposed in a substantially horizontal attitude above the spin chuck 3 so that its center is positioned above the rotation axis C of the wafer W. A circular facing surface 19A that faces the surface of the wafer W held by the spin chuck 3 is formed on a lower surface of the shield plate 19. The facing surface 19A faces an entirety of the surface of the wafer W.

A rotating shaft 20, having a vertical axis passing through the center of the shield plate 19 (vertical axis coincident with the rotation axis C of the wafer W) as a central axis, is fixed to a top surface of the shield plate 19. The rotating shaft 20 is formed to be hollow and in an interior thereof, a liquid supply pipe 21 is inserted in a state of extending in the vertical direction. A cooled DIW supply pipe 22 is connected to the liquid supply pipe 21. DIW of the ordinary temperature (approximately 25° C.) (water of a first temperature; hereinafter referred to as "ordinary temperature DIW") from a DIW supply source is supplied to the cooled DIW supply pipe 22. A cooled DIW valve 23 and a cooling unit 60 are interposed in that order from an upstream side in the cooled DIW supply pipe 22. The cooled DIW valve 23 opens and closes a flow passage of the cooled DIW supply pipe 22. Also, the cooling unit 60 is a one-pass type unit for cooling the ordinary temperature DIW from the DIW supply source and cools the DIW flowing through the cooled DIW supply pipe 22 to a predetermined low temperature (second temperature (for example, approximately 5 to 10° C.)). The cooling unit 60 is, for example, in constant operation while the substrate processing apparatus 1 is in operation (while the power is on). When the cooled DIW valve 23 is opened during operation of the cooling unit 60, DIW of low temperature (water of the second temperature; hereinafter referred to as the "cooled DIW") is supplied from the cooled DIW supply pipe 22 to the liquid supply pipe 21.

An ordinary temperature DIW supply pipe 28 is also connected to the liquid supply pipe 21. An ordinary temperature DIW valve 29 for opening and closing a flow passage of the ordinary temperature DIW supply pipe 28 is interposed in the ordinary temperature DIW supply pipe 28.

A gas flow passage 24 is formed between an inner wall surface of the rotating shaft 20 and the liquid supply pipe 21. A lower end of the gas flow passage 24 opens in an annular form around a circumference of the liquid supply pipe 21 at the lower surface of the shield plate 19.

A drying gas supply pipe 25 is connected to the gas flow passage 24. A drying gas valve 26 for opening and closing the drying gas supply pipe 25 is interposed in the drying gas supply pipe 25. When the drying gas valve 26 is opened, a drying gas is supplied from the drying gas supply pipe 25 to the gas flow passage 24. The drying gas supplied to the gas flow passage 24 is discharged downward from the annular opening at the lower end of the gas flow passage 24. For example, an inert gas is used as the drying gas. Although nitrogen gas is preferable as the inert gas, for example, argon gas, helium gas, etc., may be used besides nitrogen gas.

The rotating shaft 20 is mounted to an arm 27 extending substantially horizontally above the spin chuck 3 and is provided in a state of being suspended from the arm 27. An arm raising/lowering mechanism 31 that raises and lowers the arm 27 is coupled to the arm 27. By the raising and lowering of the arm 27, the shield plate 19 is raised and lowered between a position spaced widely upward from the spin chuck 3 and a near position of being spaced by a minute interval from the surface of the wafer W held by the spin chuck 3. During processing of the wafer W, the shield plate 19 is positioned at a predetermined position at which the facing surface 19A is spaced by a predetermined interval from the surface of the wafer W. Also, a shield plate rotating mechanism 32 that rotates the shield plate 19 via the arm 27 is coupled to the shield plate 19.

Also, the substrate processing apparatus 1 includes a control unit 30 that includes a microcomputer. The control unit 30 controls driving of the spin motor 4, the arm swinging mechanism 16, the arm raising/lowering mechanism 31, and the shield plate rotating mechanism 32 in accordance with a predetermined program. Also, the control unit 30 controls the opening and closing of the valves 23, 26, and 29 in accordance with a predetermined program.

Figure 2:
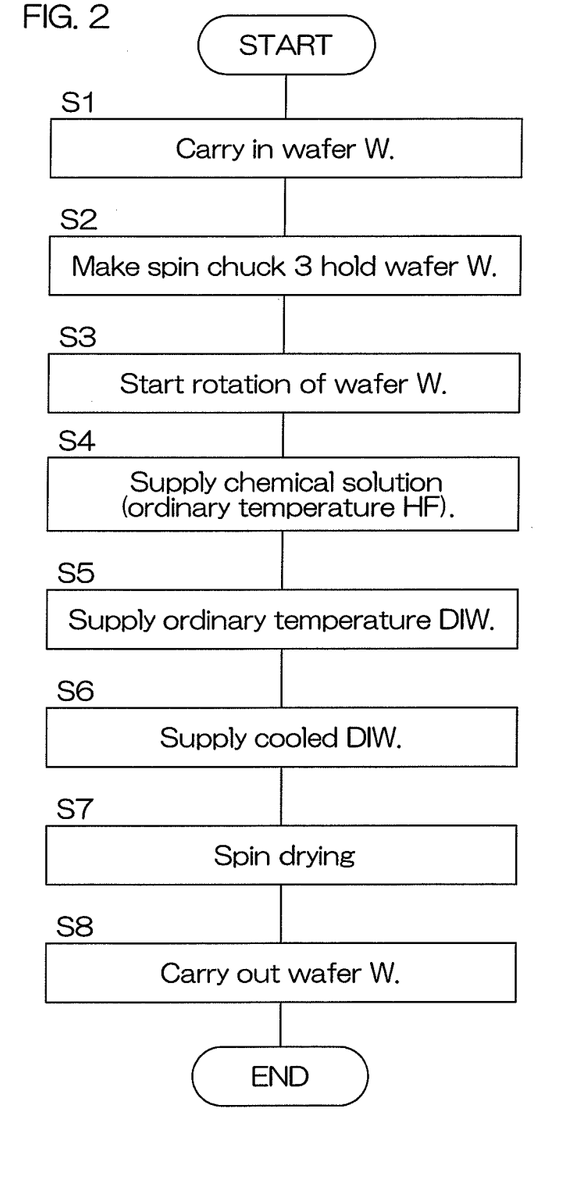
FIG. 2 is a process chart of a cleaning process performed by the substrate processing apparatus of FIG. 1.

FIG. 2 is a process chart of a cleaning process performed by the substrate processing apparatus 1. This cleaning process shall now be described with reference to FIG. 1 and FIG. 2.

A wafer W to be processed is carried by a carrying robot (not shown) into the processing chamber 2 (step S1) and is delivered to the spin chuck 3 with a surface (surface to be processed) thereof directed upward (step S2). At this point, the shield plate 19 is retracted at a position spaced widely upward from the spin chuck 3 so as not to obstruct the carrying-in of the wafer W. Also, the chemical solution nozzle 14 is positioned at the home position at the side of the spin chuck 3.

After the wafer W is held by the spin chuck 3, the control unit 30 controls the spin motor 4 and makes the wafer W be rotated at a liquid processing rotation speed (for example, 300 to 1000 rpm) (step S3) (substrate rotating step). Also, the control unit 30 swings the arm 15 to make the chemical solution nozzle 14 move from the home position to above the rotation axis C of the wafer W.

When the movement of the chemical solution nozzle 14 is completed, the control unit 30 opens the chemical solution valve 18 to supply the hydrofluoric acid from the chemical solution nozzle 14 (step S4 (chemical solution supplying step, hydrofluoric acid supplying step)), and a process using the hydrofluoric acid is thereby applied to the surface of the wafer W.

When a predetermined time elapses from the start of discharge of the hydrofluoric acid from the chemical solution nozzle 14, the control unit 30 closes the chemical solution valve 18 and stops the supply of the hydrofluoric acid from the chemical solution nozzle 14. Then, by swinging of the arm 15, the chemical solution nozzle 14 is returned from above the rotation axis C of the wafer W to the home position.

The surface of the wafer W becomes a hydrophobic surface after the hydrofluoric acid process using the hydrofluoric acid.

During the chemical solution process of step S4, the control unit 30 may control the arm swinging mechanism 16 to swing the arm 15 within a predetermined angular range. A position of the surface of the wafer W to which the hydrofluoric acid is supplied is thereby moved, for example, along an arcuate locus within a range from the rotation center of the wafer W (on the rotation axis C of the wafer W) to a circumferential edge of the wafer W.

Thereafter, a rinsing process using the ordinary temperature DIW is applied.

The control unit 30 controls the arm raising/lowering mechanism 31 to lower the shield plate 19 to a rinsing process position. The rinsing process position is a height position of the shield plate 19 at which an interval between the facing surface 19A of the shield plate 19 and the surface of the wafer W held by the spin chuck 3 is, for example, approximately 10 mm.

When the lowering of the shield plate 19 is completed, the control unit 30 opens the ordinary temperature DIW valve 29 to make the ordinary temperature DIW of, for example, 2 (liters/minute) be discharged from the lower end of the liquid supply pipe 21 (step S5 (rinsing step)). The ordinary temperature DIW discharged from the liquid supply pipe 21 is supplied to a central portion of the surface of the rotating wafer W. The ordinary temperature DIW supplied to the surface of the wafer W flows along the surface of the wafer W toward the circumferential edge due to receiving a centrifugal force due to the rotation of the wafer W and spreads across an entirety of the surface of the wafer W. The hydrofluoric acid attached to the surface of the wafer W is thereby washed off by the ordinary temperature DIW.

The rinsing process by the ordinary temperature DIW is continued for a predetermined ordinary temperature rinsing time (for example, 10 seconds).

When the discharge of the ordinary temperature DIW from the lower end of the liquid supply pipe 21 has been continued for the ordinary temperature rinsing time, the control unit 30 closes the ordinary temperature DIW valve 29 to stop the discharge of the ordinary temperature DIW.

Thereafter, the cooled DIW is coated onto the surface of the wafer W.

The control unit 30 opens the cooled DIW valve 23 to make the cooled DIW of, for example, 2 (liters/minute) be discharged from the liquid supply pipe 21 (step S6 (second temperature water supplying step)). The cooled DIW discharged from the liquid supply pipe 21 is supplied to the central portion of the surface of the rotating wafer W. The cooled DIW supplied to the surface of the wafer W flows along the surface of the wafer W toward the circumferential edge due to receiving the centrifugal force due to the rotation of the wafer W and spreads across the entirety of the surface of the wafer W. The ordinary temperature DIW on the surface of the wafer W is thus replaced by the cooled DIW and eventually, the entire surface of the wafer W is covered by a liquid film of the cooled DIW. The cooled DIW is thereby coated onto the entire surface of the wafer W. The supplying of the cooled DIW is continued for a predetermined cooled DIW supplying time (for example, 10 seconds).

When the discharge of the cooled DIW from the liquid supply pipe 21 has been continued for the cooled DIW supplying time, the control unit 30 closes the cooled DIW valve 23 to stop the discharge of the cooled DIW.

Thereafter, the control unit 30 controls the arm raising/lowering mechanism 31 and lowers the shield plate 19 to the drying position at which the facing surface 19A faces the surface of the wafer W across a minute interval (for example, approximately 0.5 to 3 mm). Also, the control unit 30 controls the spin motor 4 to accelerate the rotation speed of the wafer W to a predetermined high rotation speed (for example, approximately 1500 to 2500 rpm) (step S7: spin drying (drying step)). Also, the control unit 30 controls the shield plate rotating mechanism 32 to make the shield plate 19 undergo high speed rotation at substantially the same speed and in the same direction as the wafer W. Also, the control unit 30 opens the drying gas valve 26 to make the drying gas be discharged from the opening of the gas flow passage 24 formed in the shield plate 19. Consequently, a stable gas flow of the drying gas directed from the central portion to the circumferential edge of the wafer W is generated in the space between the surface of the wafer W and the facing surface 19A of the shield plate 19 and the atmosphere in the vicinity of the surface of the wafer W is shielded from its periphery.

When the high speed rotation of the wafer W has been continued for a predetermined time, the control unit 30 closes the drying gas valve 26 to stop the discharge of the drying gas from the gas flow passage 24. Also, the control unit 30 controls the arm raising/lowering mechanism 31 to raise the shield plate 19 to the position of being spaced widely upward from the spin chuck 3. The rotation of the wafer W is stopped. The cleaning process of a single wafer W is thereby ended and the processed wafer W is carried out from the processing chamber 2 by the carrying robot (step S8).

As described above, with the present preferred embodiment, the cooled DIW is supplied to the surface of the wafer W and the entire surface is coated with the cooled DIW after the rinsing process of step S5 and before the start of the spin drying of the step S7. The cooled DIW has a water temperature of 5 to 10° C. and evaporates less readily in comparison to the ordinary temperature DIW of approximately 25° C.

Figure 3:
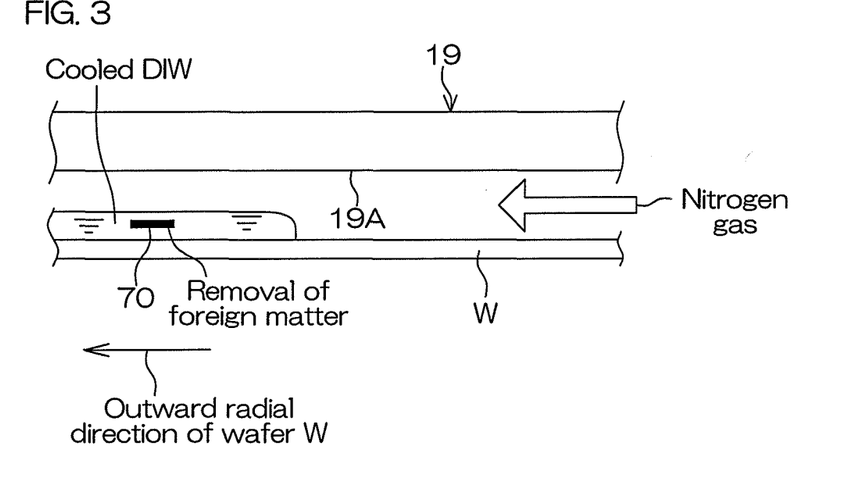
FIG. 3 is a schematic view of a state of a wafer during spin drying in FIG. 2.

As shown in FIG. 3, after the end of the coating of the cooled DIW (step S6), the cooled DIW is attached to the surface of the wafer W. In this state, even if the rotation speed of the wafer W is raised to a high rotation speed and the spin drying is started, the cooled DIW attached to the surface of the wafer W does not evaporate immediately after the start of spin drying. Thus, in a case where a contaminant or other foreign matter 70 is contained in the low temperature DIW, the low temperature DIW is present in a periphery of the foreign matter 70 for a while even after the start of spin drying. The DIW is spun off, together with the foreign matter 70, from the surface of the wafer W by the high speed rotation of the wafer W. The wafer W can thereby be dried while preventing the remaining of foreign matter on the surface of the wafer W.

Also, with the present preferred embodiment, the rinsing process is performed on the surface of the wafer W using the ordinary temperature DIW. The rinsing process performed using the ordinary temperature DIW is higher in processing efficiency than a rinsing process performed using the cooled DIW. The rinsing process can thus be applied satisfactorily to the surface of the wafer W.

Also, in a case where DIW is attached to the surface of the wafer W, elution of silicon (Si) from the wafer W into the DIW is more suppressed when the DIW is of low temperature (5 to 10° C.) than when the DIW is of the ordinary temperature. Although the surface of the wafer W after processing using hydrofluoric acid is a hydrophobic surface with which an amount of elution of silicon is comparatively high, the amount of elution of silicon into cooled DIW is not high even in this case.

With the present preferred embodiment, the spin drying is started in the state where the cooled DIW is attached to the surface of the wafer W and thus hardly any silicon is contained in the DIW attached to the surface of the wafer W when the spin drying is started. A water mark due to eluted silicon thus does not form on the surface of the wafer W after the spin drying. Water mark formation can thereby be suppressed without using an organic solvent, such as IPA.

Figure 4:
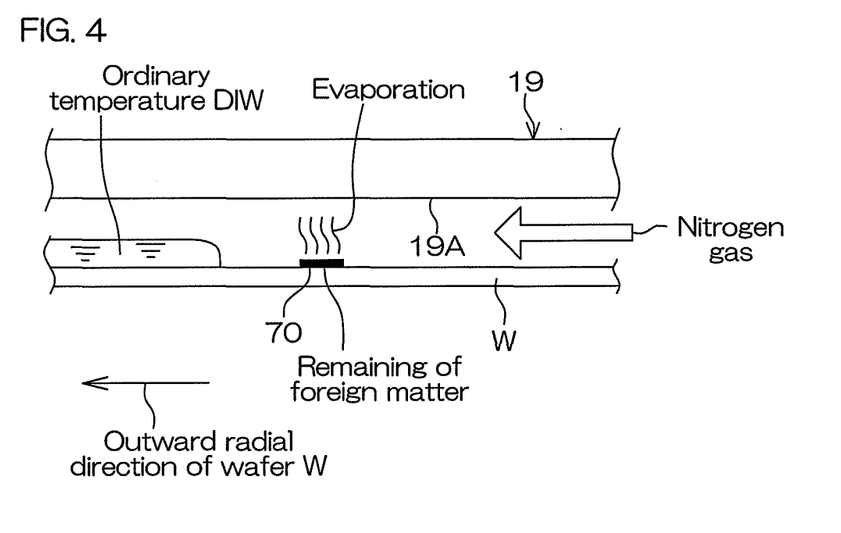
FIG. 4 is a schematic view of a state of a wafer in a comparative example.

A case (comparative example) where, on the other hand, spin drying (step S7) is performed immediately following the rinsing process (step S5; ordinary temperature DIW supplying) as shown in FIG. 4 shall now be examined. In this case, the ordinary temperature DIW is attached to the surface of the wafer W. When in this state, the rotation speed of the wafer W is raised to the high rotation speed and the spin drying is started, although the ordinary temperature DIW attached to the surface of the wafer W moves toward the circumferential direction of the wafer W, an amount of water that vaporizes on the spot due to evaporation is comparatively large. Thus, in a case where a contaminant or other foreign matter 70 is contained in the DIW, there is a high possibility of the foreign matter 70 becoming attached to the wafer W due to evaporation of the ordinary DIW in the periphery thereof after the start of spin drying, and the foreign matter 70 remains attached to the surface of the wafer W and is not spun off by the high speed rotation of the wafer W. Consequently, the foreign matter 70 may remain on the surface of the wafer W after the drying process.

Although a preferred embodiment of the present invention has been described above, the present invention may be carried out in yet other modes as well.

The second temperature may, for example, be another temperature as long as it is a temperature lower than the ordinary temperature (and yet a temperature higher than a freezing point of water). That is, as the water of the second temperature, water having a liquid temperature higher than the freezing point of water and lower than 5° C. may be used or water having a temperature higher than 10° C. and lower than the ordinary temperature (approximately 25° C.) may be used.

Also, as the water of the first temperature, water having a liquid temperature higher than the ordinary temperature (for example, 40° C. to 80° C.) may be used.

As the water, the description has been given citing DIW as an example. However, the water of the first temperature or the second temperature is not restricted to DIW and carbonated water, electrolyzed ion water, ozone water, aqueous hydrochloric acid of dilute concentration (for example, approximately 10 to 100 ppm), reduced water (hydrogen water), etc., may be used instead.

As the chemical solution supplied to the substrate before the rinsing process, that which is in accordance with details of the processing of the surface of the wafer W is used. For example, if the process is a cleaning process for removing particles from the surface of the wafer W, a cleaning liquid, such as SC1 (ammonia-hydrogen peroxide mixture), is used. If the process is a cleaning process for etching an oxide film, etc., from the surface of the wafer W, a cleaning liquid containing a chemical solution, such as hydrofluoric acid or BHF (buffered HF), is used. If the process is a polymer removing process for removing a resist residue that has polymerized and remains on the surface of the wafer W after resist removal, a polymer removing liquid, such as SPM (sulfuric acid/hydrogen peroxide mixture) or SC1 (ammonia-hydrogen peroxide mixture), is used. In a case of a cleaning process of removing a metal contaminant, a chemical solution, such as hydrofluoric acid, SC2 (hydrochloric acid/hydrogen peroxide mixture), or SPM (sulfuric acid/hydrogen peroxide mixture), is used.

Although the preferred embodiments of the present invention have been described in detail, these embodiments are merely specific examples used to clarify the technical contents of the present invention, and the present invention should not be understood as being limited to these specific examples, and the spirit and scope of the present invention are limited solely by the appended claims.

The present application corresponds to Japanese Patent Application No. 2012-78235 filed in the Japan Patent Office on Mar. 29, 2012, and the entire disclosure of this application is incorporated herein by reference.

What is claimed is:

1. A substrate processing method comprising:
   a hydrofluoric acid supplying step of supplying a hydrofluoric acid to a surface of a silicon substrate to apply a hydrophobizing process using the hydrofluoric acid to the silicon substrate surface;
   a rinsing step, executed after the hydrofluoric acid supplying step, of supplying water at room temperature to the silicon substrate surface to apply a rinsing process using the water to the silicon substrate surface;
   a second temperature water supplying step of supplying water at a second temperature lower than room temperature and in a range of 5° C. to 10° C., wherein the water at the second temperature is supplied to the silicon substrate surface in the second temperature water supplying step;
   a substrate rotating step of rotating the silicon substrate that is executed in parallel to the rinsing step and the second temperature water supplying step; and
   a drying step of rotating the silicon substrate after the second temperature water supplying step to spin off water on the silicon substrate surface to a periphery of the silicon substrate and thereby to dry the silicon substrate.

2. The substrate processing method according to claim 1, further comprising: a step of making a facing member, having a facing surface facing the silicon substrate surface, to rotate in a same direction as the silicon substrate, and, at the same time, supplying a gas between the facing surface and the silicon substrate surface in parallel to the drying step.

3. The substrate processing method according to claim 1, wherein said room temperature is approximately 25° C.

4. A substrate processing method comprising:
   a hydrofluoric acid supplying step of supplying a hydrofluoric acid to a surface of a silicon substrate to apply a hydrophobizing process using the hydrofluoric acid to the silicon substrate surface;
   a rinsing step, executed after the hydrofluoric acid supplying step, of supplying water at room temperature to the silicon substrate surface to apply a rinsing process using the water to the silicon substrate surface;
   a second temperature water supplying step of supplying water at a second temperature lower than the room temperature and in a range of 5° C. to 10° C., wherein the water at the second temperature is supplied to the silicon substrate surface in the second temperature water supplying step;
   a drying step of rotating the silicon substrate after the second temperature water supplying step to spin off water on the silicon substrate surface to a periphery of the silicon substrate and thereby to dry the silicon substrate; and
   a step of making a facing member, having a facing surface facing the silicon substrate surface, to rotate in a same direction as the silicon substrate, and, at the same time, supplying a gas between the facing surface and the silicon substrate surface in parallel to the drying step.

5. The substrate processing method according to claim 4, wherein said room temperature is approximately 25° C.

\* \* \* \* \*